US009537453B2

(12) United States Patent
Griffith

(10) Patent No.: US 9,537,453 B2
(45) Date of Patent: Jan. 3, 2017

(54) POWER AMPLIFIER HAVING SEPARATE INTERCONNECTS FOR DC BIAS AND RF MATCHING NETWORKS

(71) Applicant: TELEDYNE SCIENTIFIC & IMAGING, LLC., Thousand Oaks, CA (US)

(72) Inventor: Zachary M. Griffith, Thousand Oaks, CA (US)

(73) Assignee: TELEDYNE SCIENTIFIC & IMAGING, LLC., Thousand Oaks, CA (US)

( * ) Notice: Subject to any disclaimer, the term of this patent is extended or adjusted under 35 U.S.C. 154(b) by 47 days.

(21) Appl. No.: 14/517,250

(22) Filed: Oct. 17, 2014

(65) Prior Publication Data

US 2016/0112014 A1    Apr. 21, 2016

(51) Int. Cl.
```
H03F 3/68       (2006.01)
H03F 1/56       (2006.01)
H03F 3/21       (2006.01)
H03F 1/02       (2006.01)
H03F 3/193      (2006.01)
H03F 3/195      (2006.01)
H03F 3/60       (2006.01)
```
(52) U.S. Cl.
CPC .............. *H03F 1/56* (2013.01); *H03F 1/0283* (2013.01); *H03F 3/193* (2013.01); *H03F 3/195* (2013.01); *H03F 3/211* (2013.01); *H03F 3/604* (2013.01); *H03F 2200/318* (2013.01); *H03F 2200/451* (2013.01); *H03F 2203/21106* (2013.01); *H03F 2203/21142* (2013.01)

(58) Field of Classification Search
CPC ........................................................ H03F 1/56
USPC ...................... 330/295, 124 R, 302, 277, 289
See application file for complete search history.

(56) References Cited

U.S. PATENT DOCUMENTS 3,764,932 A * 10/1973 Robinson ................ H03F 3/245
                                                            330/297
7,382,186 B2 * 6/2008 Apel ..................... H03F 1/0277
                                                            330/124 R \* cited by examiner

*Primary Examiner* — Khanh V Nguyen
*Assistant Examiner* — Khiem Nguyen
(74) *Attorney, Agent, or Firm* — Brooks Acordia IP Law, P.C.

(57) ABSTRACT

An amplifier cell apparatus has an RF input node, a first power transistor in communication with the input node through a first input impedance matching network, a second power transistor in communication with the input node through a second input impedance matching network, and an RF output node in communication with the first and second power transistors through a single output impedance matching network so that the first and second input impedance matching networks are disposed on an RF input side of the amplifier cell.

14 Claims, 5 Drawing Sheets

POWER AMPLIFIER HAVING SEPARATE INTERCONNECTS FOR DC BIAS AND RF MATCHING NETWORKS

BACKGROUND

1. Field of the Invention

The invention relates to power amplifiers, and more particularly to radio frequency (RF) power amplifiers.

2. Description of the Related Art

The rapid development of E-band and W-band communications, radar, and imaging systems, has been facilitated by the use of power amplifier cell arrays developed using indium phosphide (InP) and silicon-germanium (SiGe) heterojunction bipolar transistor (HBT) technologies achieving high current and low voltage solutions. A gallium nitride (GaN) high electron mobility transistor (HEMT) power amplifier cell (high voltage, low current technology) for use in such arrays may utilize thru-substrate reactive microstrip for power combining with adjacent cells. The RF matching networks may share the same RF matching structure as that used for DC current in such arrays.

Unfortunately, as such topologies are used for ever-higher frequency and output power applications, usable bandwidth in such power amplifier cell arrays tends to decrease. A need continues to exist to provide for high frequency and high power RF power amplifiers while maintaining or extending usable bandwidth.

SUMMARY

An amplifier cell apparatus includes an RF input node, a first power transistor in communication with the input node through a first input impedance matching network, a second power transistor in communication with the input node through a second input impedance matching network, and an RF output node in communication with the first and second power transistors through a single output impedance matching network so that the first and second input impedance matching networks are disposed on an RF input side of the amplifier cell. In one embodiment, the first and second power transistors may be connected in a common emitter configuration and the first input impedance matching network is connected to a base of the first power transistor. The single output impedance matching network is connected to a shared collector node of the first and second power transistors. In another embodiment, the apparatus may include an RF ground capacitor connected to a shared collector node of the first and second power transistors through at least a portion of the output impedance matching network. The first and second power transistors may also be identical, and may include a direct-current (DC) collector bias bus line disposed on the RF input side, the DC collector bias bus line connected to a shared collector node of the first and second power transistors and a DC base bias bus line connected to respective bases of the first and second power transistors.

An amplifier cell apparatus is also disclosed that includes an RF input node, first and second impedance circuits in communication with the RF input node, the first and second impedance circuits in communication with first and second power transistors, respectively, and an RF ground capacitor disposed between the first and second impedance circuits. Such an apparatus may also include a direct-current (DC) bias bus and separate from the first impedance circuit on an input side of the first and second power transistors. Such an embodiment may also include an RF output node connected to a shared node of the first and second power transistors through at least a portion of an RF output impedance matching network. In one embodiment, the shared node is a shared collector node. In another embodiment, the shared node is a shared drain node. In a further embodiment a DC base bias bus line may be connected to respective bases of the first and second power transistors, the DC base bias bus line disposed across and spaced apart from at least a portion of the RF output impedance matching network.

An amplifier cell operation method is disclosed that includes splitting a radio-frequency (RF) input signal for presentation to first and second power transistors through first and second impedance matching paths, respectively, and providing an RF output signal to an output node through a single output impedance matching network so that the first and second impedance matching paths are disposed on an RF input side of the first and second power transistors and the output node is on an RF output side of the first and second power transistors. The method may also include providing direct-current (DC) collector bias current on the RF input side to a shared collector node of the first and second power transistors or providing direct-current (DC) drain bias on the RF input side to a shared drain node of the first and second power transistors. The method may include providing DC base bias current to respective base terminals of the first and second power transistors. In some embodiments, the providing DC base bias current step is accomplished on the RF input side. The providing the DC base bias current may also be accomplished on the RF output side.

An amplifier array is disclosed that includes a first power amplifier cell having an RF input node and first and second power transistors in communication with the RF input node through first and second impedance circuits, respectively. The array may include a second power amplifier cell having an RF output node in communication with RF input node of the first power amplifier cell, the RF output node also in communication with third and fourth power transistors through a single output impedance matching network, so that the first and second power amplifiers form a two stage array of power amplifiers. In such arrays, the first power amplifier may also include a DC collector bias bus line connected to a shared collector node of the first and second power transistors. The array may also include a third power amplifier cell having fourth and fifth power transistors in communication with the DC collector bias bus line.

BRIEF DESCRIPTION OF THE DRAWINGS

The components in the figures are not necessarily to scale, emphasis instead being placed upon illustrating the principals of the invention. Like reference numerals designate corresponding parts throughout the different views.

DETAILED DESCRIPTION

An RF input side of an amplifier cell may have an RF input node in communication with first and second power transistors through first and second input impedance matching networks, respectively. Unlike the RF input side, the RF output side has only a single output impedance matching network, with a portion of the single output impedance matching network connected between the RF output node and a shared node of the first and second power amplifiers. This inventive cell topology enables separate interconnects for the DC bias and RF matching interconnects so that DC current to be supplied from the RF input side of the power amplifier (PA) cell avoids interconnect crossovers that would otherwise reduce output power. Also, by using separate interconnects for the DC bias and RF matching interconnects, the minimum width of the RF matching interconnects is not constrained by DC current handling limits and so high output power may be achieved while maintaining or extending the usable bandwidth found in previous amplifier designs.

Figure 1:
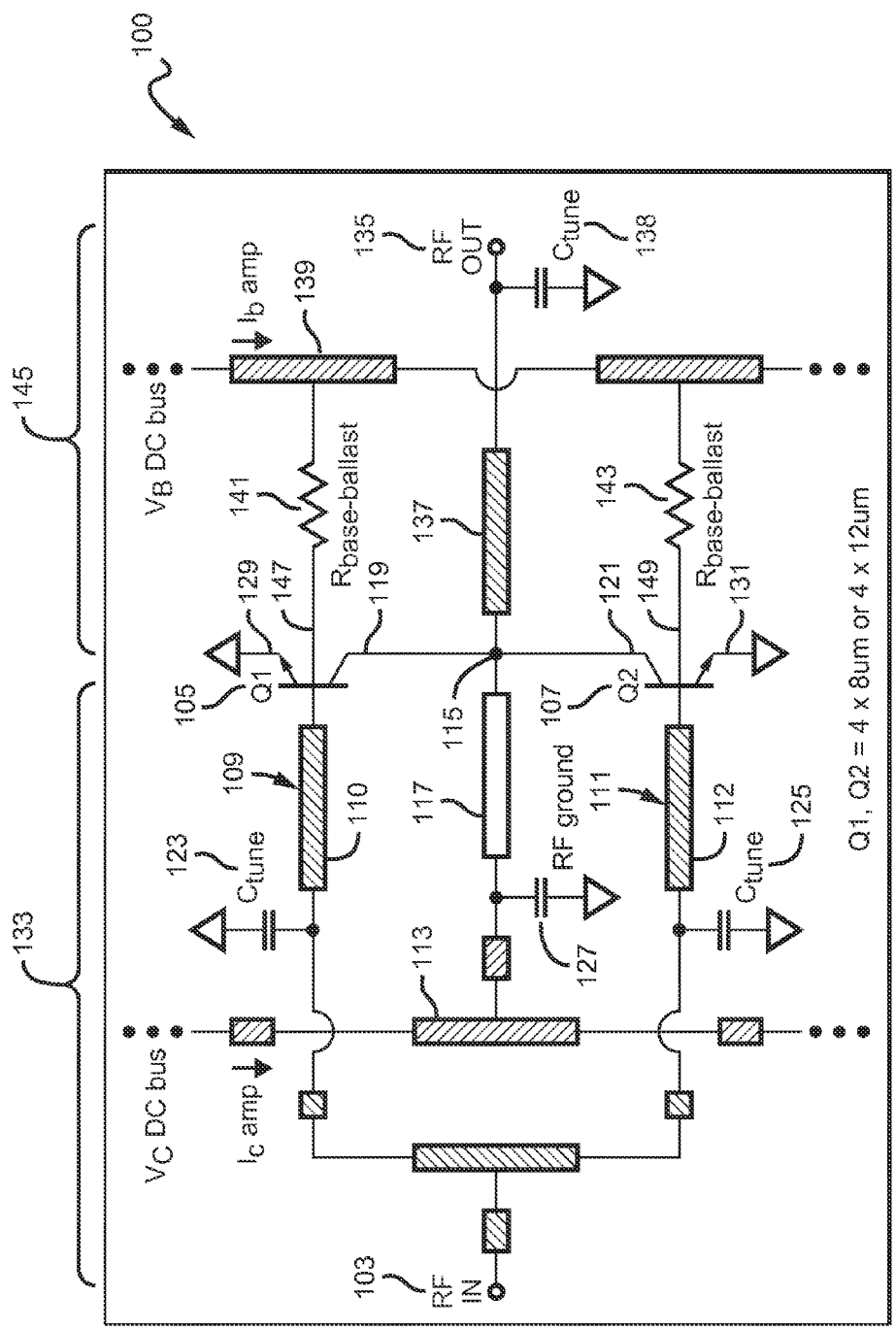
FIG. 1 is a schematic of one embodiment of a power amplifier cell using HBT transistors and having separate interconnects for the DC bias and RF matching interconnects.

FIG. 1 is a schematic illustrating one embodiment of a power amplifier cell 100 having two impedance matching networks on an RF input side, and a single output impedance matching network spanning an RF input and RF output side to provide separate interconnects for the DC bias and RF matching interconnects. An RF input node 103 is in communication with respective bases (105, 107) of first and second power transistors (Q1, Q2) through first and second input impedance matching networks (109, 111), respectively. Each of the first and second input impedance matching networks (109, 111) provide impedance matching to an RF input (not shown) presented to the RF input node 103 at a pre-determined operation frequency and includes first and second series tuning transmission lines (110, 112).

A DC collector bias bus line 113 may pass under or over each of the first and second impedance matching networks (109, 111), with the DC collector bias bus line 113 also connected to a shared collector node 115 of the first and second power transistors (Q1, Q2) through a shunt transmission tuning line 117. The shared collector node 115 is connected to collectors (119, 121) of the first and second power amplifiers (Q1, Q2), respectively. The first impedance matching network 109 may also include a shunt tuning capacitor Ctune 123 in communication with the first series tuning transmission line 110 to set an impedance of the first impedance matching network 109. The second impedance matching network 111 may also include a second shunt tuning capacitor 125 in communication with the second series transmission line 112 to set an impedance of the second impedance matching network 111. An RF ground capacitor 127 is connected to the shared collector node 115 through the series transmission tuning line 117 to provide a low impedance path to common RF ground potential at the lowest desired frequency of operation, and may be disposed between the first and second impedance matching networks (109, 111) to enable closer placement to the transistors (Q1, Q2). The RF input side 133 may be loosely defined by the physical region encompassing the various components and transmission lines described, above.

An RF output node 135 is in communication with the shared collector node 115 through a single output impedance matching network 137 that includes the shunt transmission tuning line 117 portion of the network 137. A shunt capacitive tuning element 138 is also connected between the shared collector node 115 and RF output node 135. A base bias DC bus 139 is connected to base nodes (105, 107) of the transistors (Q1, Q2) through base ballast resistors (141, 143). The base ballast resistors (141, 143) may present a voltage bias to the base nodes of the transistors (Q1, Q2) to turn on the transistors (Q1, Q2). The base bias DC bus 139 may extend underneath the single output impedance matching network 137. The RF output side 145 may be loosely defined by the physical region encompassing the RF output node 135, single output impedance matching network 137, and base ballast resistors (141, 143).

In one embodiment, each of the first and second power transistors (Q1, Q2) may be heterojunction bipolar transistors (HBT) having their emitter terminals (129, 131) connected to RF and DC ground potential to establish a common emitter configuration. In an alternative embodiment, transistors Q1 and Q2 may be bipolar junction (BJT) transistors. The first and second series transmission lines for tuning (109, 111) may be formed using a lowest interconnect layer (MET-1) as DC and RF ground potential, and the upper two interconnect layers (MET-2 (preferably 1-um thick) 1 um interlayer dielectric spacing, and MET-3 (3-um thick) 7-um interlayer dielectric spacing to MET-1, respectively) for signal routing. Use of a substrate-shielding MET-1 ground plane prevents coupling between PA cells through the InP substrate.

In one non-limiting embodiment intended to accomplish a relatively constant gain across 65-95 GHz and generally in accordance with FIG. 3, below, the components and buses may have the values described in Table 1.

TABLE 1

| Component/Bus | Value |
| --- | --- |
| Technology | 250 nm InP HBT |
| First and second power transistors (Q1, Q2) | 0.25 um × 12 um × 4-fingers |
| Ctune 123 | 80-fF |
| Ctune 125 | 80-fF |
| RF ground capacitor 127 | 1.4-pF |
| base ballast resistors 141 | 650-Ohm |
| base ballast resistors 143 | 650-Ohm |
| shunt capacitive tuning element 138 | 37.5-fF |
| first impedance matching network 109 | >=50-Ohms |
| second impedance matching network 111 | >=50-Ohms |
| DC collector bias bus line 113 | 25-um × 135-um |
| output impedance matching network 137 | >=50-Ohms |

During operation, an RF signal is presented to the RF IN terminal and subsequently split for communication over or under the DC collector bias bus line 113 to first and second impedance matching networks (109, 111) that are spaced apart from one another to provide room for the large RF ground capacitor 127 and shunt transmission line 117 described in further detail, below. The first and second impedance matching networks (109, 111) may be tuned by respective first and second input shunt tuning capacitors (123, 125), for subsequent communication to respective base terminals (147, 149) of the first and second power transistors (Q1, Q2). The first and second transistors (Q1, Q2) are turned on through application of DC biasing provided at each of their respective base nodes (105, 107) and collectors (119, 121), and the transistors (Q1, Q2) then provide amplification and power gain to the now split signals using DC current fed to the transistors (Q1, Q2) through the DC bias bus line 113. An output impedance is provided by the shunt transmission line 117 and series transmission line 137, as tuned by shunt RF ground capacitor 127. The shunt transmission line 117 and series transmission line 137 may collectively be referred to as a combined output matching network, so that maximum output power can be harvested from the transistors (Q1, Q2). The signal proceeds after amplification and power gain from the shared collector node 115 through the series transmission line 137, with supplemental impedance matching provided by the output tuning capacitor 138, for presentation to the RF output terminal 135.

Figure 2:
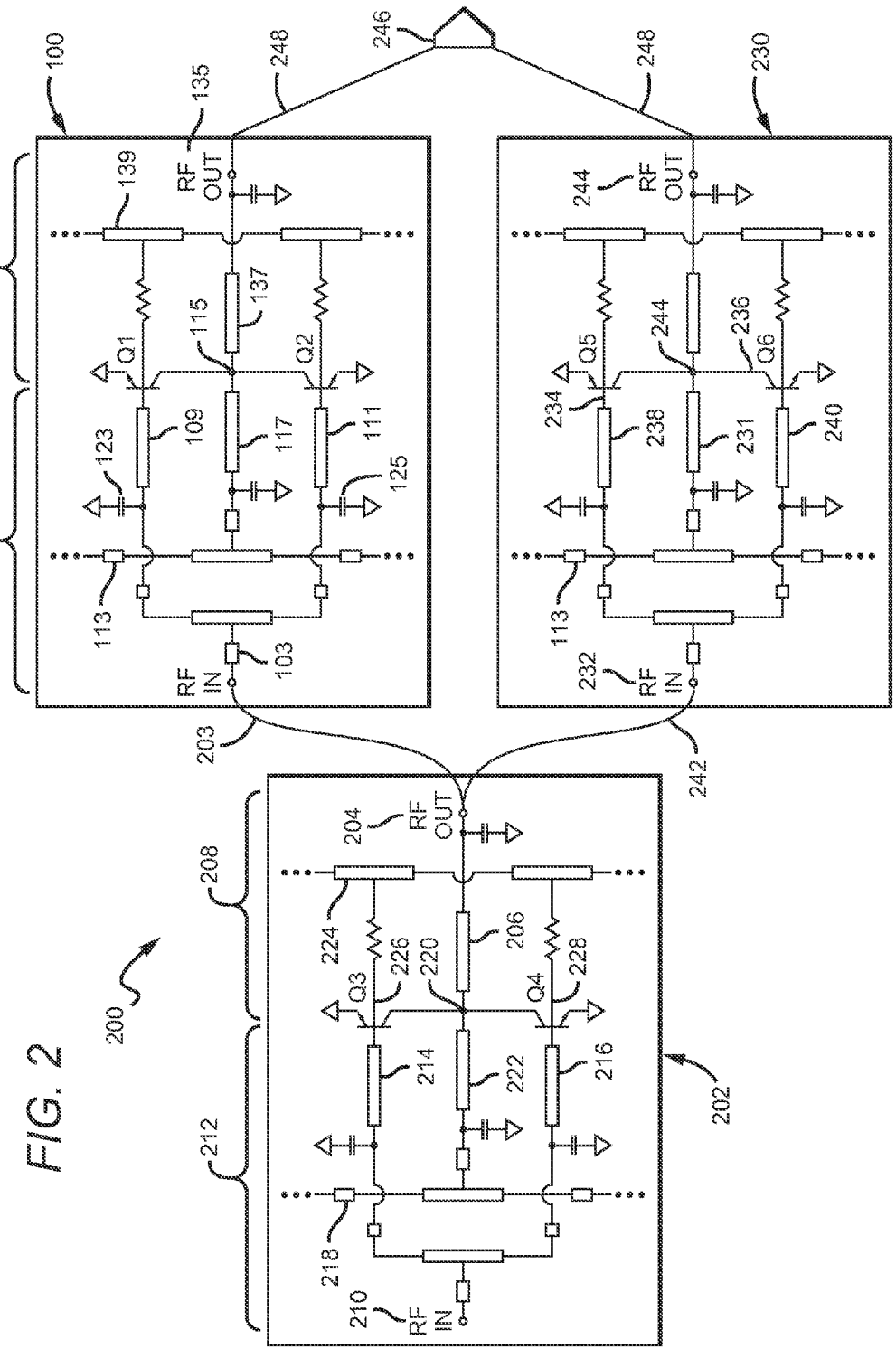
FIG. 2 a block diagram illustrating one embodiment of an array of power amplifier cells first illustrated in FIG. 1.

FIG. 2 illustrates one embodiment of a 2-gain-stage, 2-PA combined-cell, solid-state power amplifier (SSPA) array 200 combining two power amplifier cells of the type first illustrated in FIG. 1 to achieve higher RF gain and to achieve higher RF output power. As illustrated in FIG. 1, first and second power transistors (Q1, Q2) may be in communication with an RF input node 103 on an RF input side 133 through first and second input impedance matching networks (109, 111), respectively. Unlike the RF input side 133, the RF output side 145 has only a single output impedance matching network 137, with a portion 137 of the single output impedance matching network connected between the RF out 135 and a shared collector node 115 of the first and second power amplifiers (Q1, Q2). The remainder of the output impedance matching network is found in the shunt transmission tuning line 117 that may also introduce DC collector bias from the DC collector bias bus line 113. The DC collector bus bias line 113 may be disposed across and spaced apart from the first and second input impedance matching networks (109, 111) (i.e., not electrically connected).

The first and second input impedance matching networks (109, 111), in combination with the first and second shunt tuning capacitors Ctune (123, 125), provide impedance matching at the pre-determined operation frequency for a preceding input stage second power amplifier cell 202 having an RF output node 204 connected to the RF input node 103 through line 203. Within the input power amplifier cell 202, third and fourth power transistors (Q3, Q4) are in communication with the RF output node 204 through a single output impedance matching network 206 on an output side 208, and with an RF input node 210 on an input side 212 through first and second input impedance matching networks (214, 216), respectively. A DC collector bias bus line 218 may be in electrical communication with a shared collector node 220 of the third and fourth transistors (Q3, Q4) through a shunt transmission tuning line 222. A DC base bias line 224 may be in electrical communication with respective bases (226, 228) of the third and fourth transistors (Q3, Q4) to provide turn-on voltage.

A third power amplifier cell 230 may be added in parallel with the first power amplifier cell 100 to complete the 2-stage, 2-cell array 200. In such an embodiment, the RF output node 204 of the input power amplifier cell 202 is in communication with input nodes (103, 232) of both the first power amplifier cell 100 and third power amplifier cell 230. The RF input node 232 of the third power amplifier 230 is in communication with respective bases (234, 236) of fifth and sixth power transistors (Q5, Q6) through first and second input impedance matching networks (238, 240), respectively, for impedance matching to the output of the second power amplifier cell 202 through line 242 at the pre-determined operation frequency. The DC bias line 113 described above in the first power amplifier cell 100 may electrically extend to the third power amplifier cell 230 through a shunt transmission tuning line 231 for communication of DC current to a shared collector node 244 of the fifth and sixth power transistors (Q5, Q6). The shared collector node 220 is connected to collectors (224, 226) of the fifth and sixth power amplifiers (Q1, Q2), respectively. Both RF output nodes (244, 135) may be added together and they may be in communication with an antenna 246 through lines 248 and 250, respectively.

Figure 3:
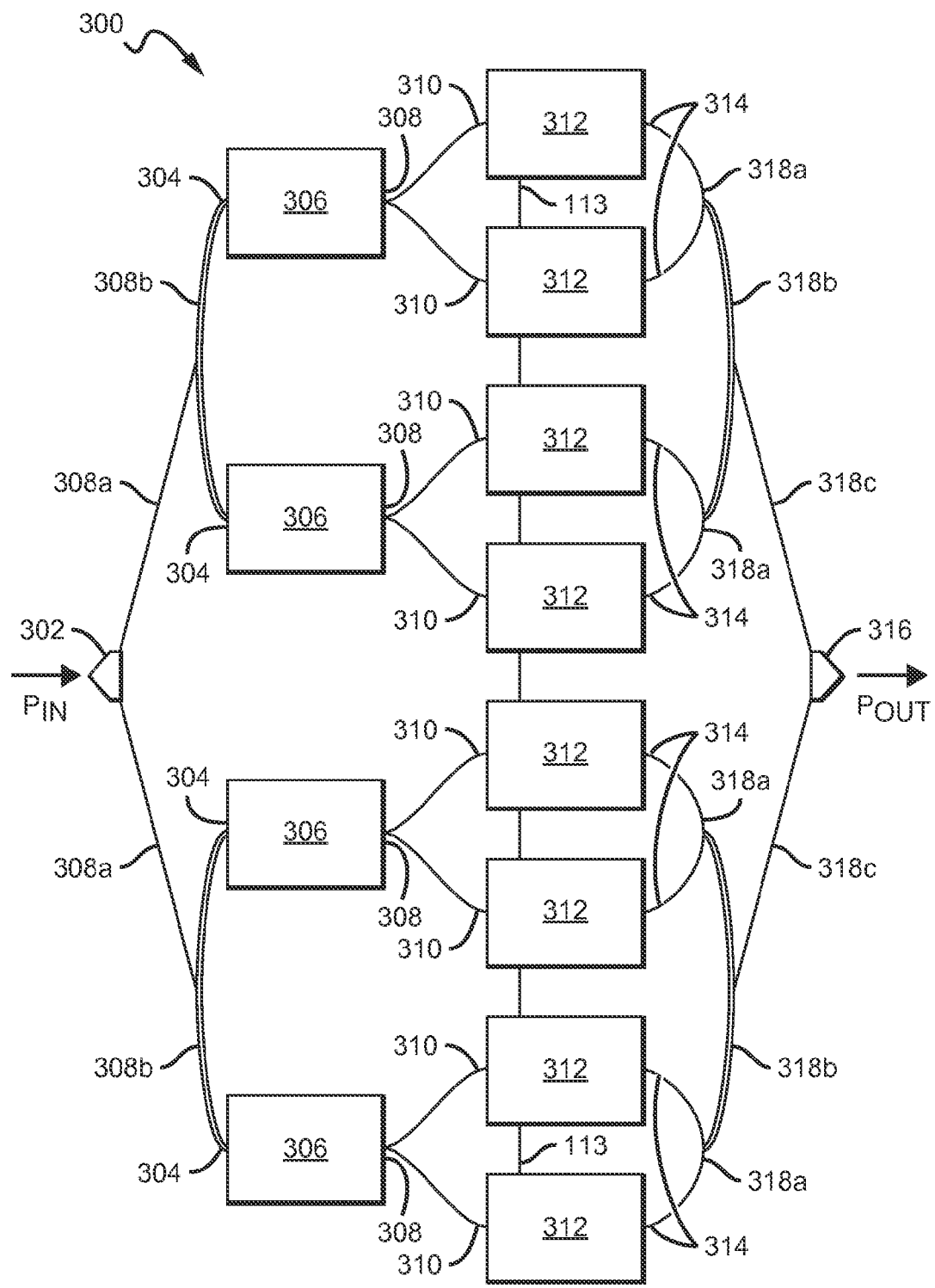
FIG. 3 is a block diagram illustrating another embodiment of an array of power amplifier cells.

FIG. 3 is a block diagram illustrating a multistage array 300, in the illustrated embodiment a 2-stage, 12-cell SSPA, that uses a plurality of the power amplifier cells first illustrated in FIG. 1. An RF input 302 is in communication with an RF input node 304 of each respective first stage amplifier cell 306 to provide initial amplification of an RF input signal (Pin), with the first stage amplifier cell 306 preferably using separate interconnects for the DC bias and RF matching interconnects as described, above. Each of the signal line segments 308a are equal in length (indicated by a single-weight line) and each of the signal line portions 308b (indicated by a double line) are also each equal in length to each other, so that the signals provided by the RF input 302 travel the same distance to each respective RF input node 304. Each RF output node 308 of each first stage amplifier cell 306 is connected to a respective RF input node 310 of each second stage amplifier cell 312. Each second stage amplifier cell 312 may also use separate interconnects for the DC bias and RF matching interconnects as described, above. An RF output node 314 for each second stage amplifier cell 312 is in communication with an RF output antenna 316 through signal line portions 318a, 318b, and 318c. Each of the signal line portions 318a are of equal length (indicated with single-weighted lines). Each of the 318b signal line portions are also of equal length, as are each of the 318c signal line portions to each other, so that the total path length from each respective RF output node 314 to the RF output 316 are equal to achieve proper signal combining The DC collector bias bus line 113 (see FIGS. 1, 2) may electrically extend between and among the second stage amplifier cells 312, using the illustrated stacked PA cell approach, so that the DC collector bias bus line 113 may be a common DC bus for the plurality of second stage amplifier cells 312.

Figure 4:
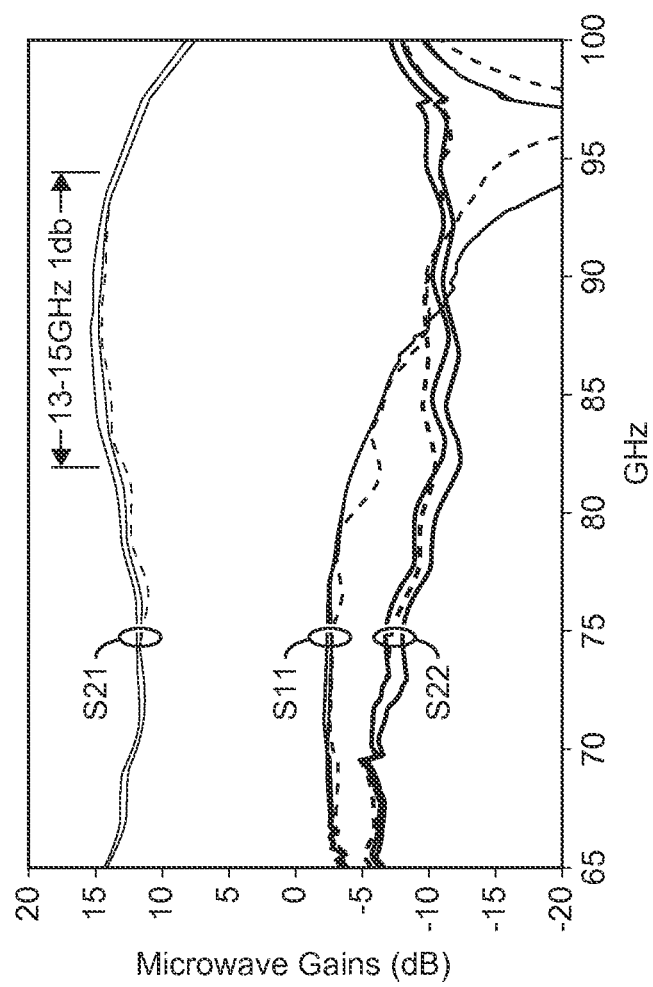
FIG. 4 is a plot illustrating gain vs. bandwidth for the power amplifier cell first illustrated in FIG. 1.

FIG. 4 is a plot for three amplifier builds of the microwave gain (dB) versus frequency (GHz), illustrating the high bandwidth S-parameter performance and very low build-to-build variation of a 2-stage, 8-cell, InP HBT E-band solid-state power amplifier (SSPA) demonstrating 13-15 dB $S_{21}$ gain and a bandwidth associated with 1dB gain roll-off between 81-94 GHz. The $S_{21}$ amplifier gain remains high down to 65 GHz operating frequency. Predictive simulated performance of this amplifier is 1.0 W RF output power $P_{out}$, 10 dB large-signal power gain, and 30% power added efficiency (PAE) over the 81-94 GHz (13 GHz bandwidth) frequency span, thereby achieving high frequency and high power RF power amplification while maintaining or extending typical usable bandwidth compared to the prior art.

Figure 5:
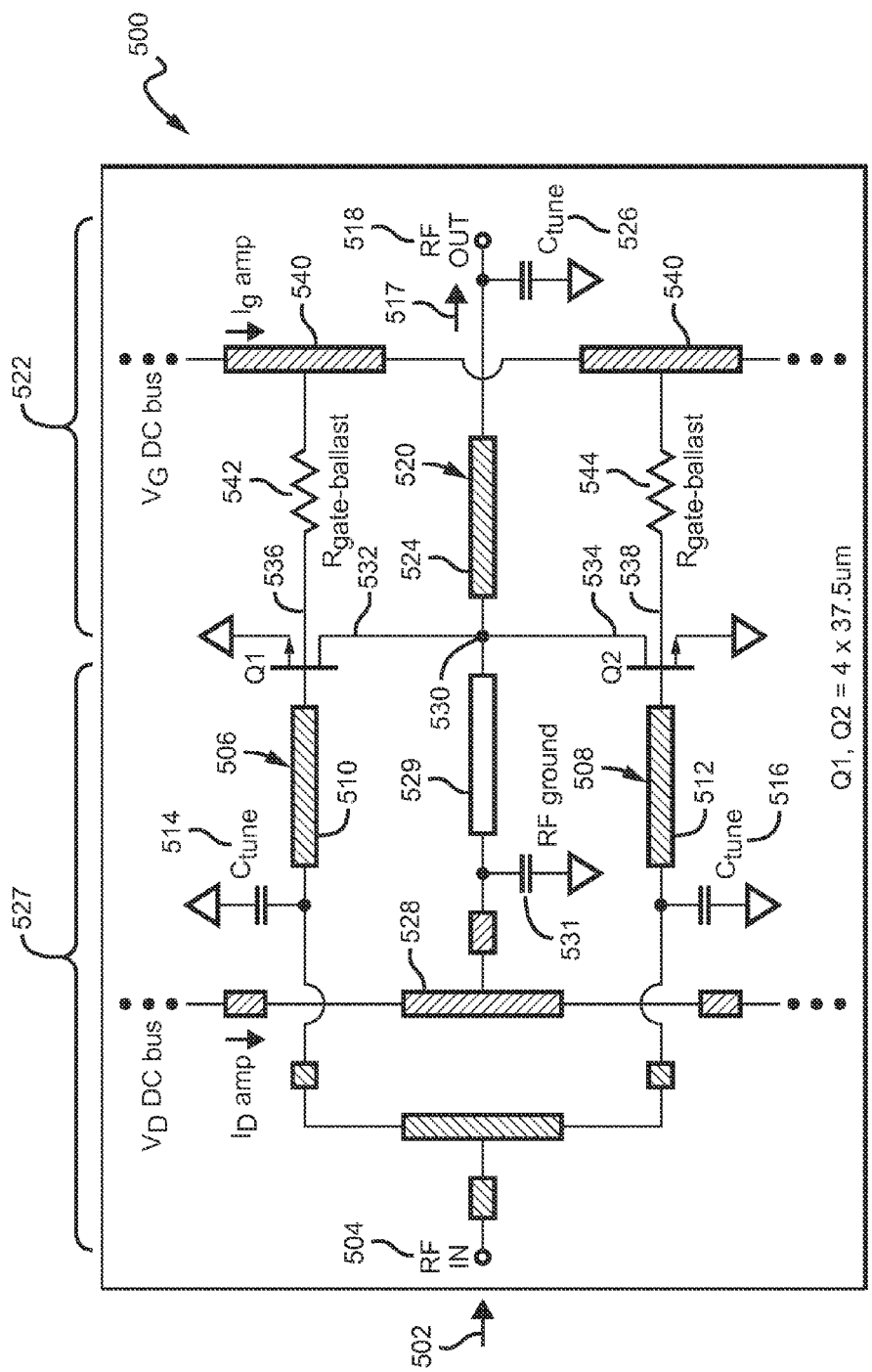
FIG. 5 is a schematic of another embodiment of a power amplifier cell having separate DC bias and RF matching interconnects using field effect transistors (FET) or HEMT transistors.

FIG. 5 is a schematic of another embodiment of a power amplifier cell 500 having separate DC bias and RF matching interconnects using FET or HEMT power transistors. An RF input signal 502 may be presented to an RF input node 504 and split for presentation to first and second power transistors (Q1, Q2) through first and second impedance matching networks (506, 508), respectively, that provide impedance matching for the RF input. The first and second impedance matching networks (506, 508) have first and second series tuning transmission lines (510, 512) and may include respective shunt capacitors Ctune (514, 516) in communication with the series tuning transmission lines (510, 512) to set an impedance for each of the respective impedance matching networks (506, 508). An RF output signal 517 is provided to an RF output node 518 through a single output impedance matching network 520 on the output side 522 that may include a series transmission line 524 and shunt tuning capacitor Ctune 526. DC drain bias and DC current feed may be provided on the RF input side 527 by a DC drain bias bus line 528 to a shared drain node 530 through a series transmission tuning line 529. An RF ground capacitor 531 may be in communication with the shared drain node 530 through the series transmission tuning line 529 to provide a low impedance to common RF ground potential path at the lowest desired frequency of operation, and may be disposed between the series tuning transmission lines (510, 512) of the impedance matching networks (506, 508) to enable closer placement to the transistors (Q1, Q2). The shared drain node 530 is in communication with respective drains nodes (532, 534) of the first and second power transistors (Q1, Q2). DC gate bias may be provided on the output side 522 to respective gate terminals (536, 538) of the first and second power transistors (Q1, Q2) by a DC gate bias bus line 540 through respective gate-ballast resistors (542, 544).

While various implementations of the application have been described, it will be apparent to those of ordinary skill in the art that many more embodiments and implementations are possible that are within the scope of this invention.

I claim:

1. An amplifier cell apparatus, comprising:
   an RF input node;
   a first power transistor in communication with the input node through a first input impedance matching network;
   a second power transistor in communication with the input node through a second input impedance matching network;
   an RF output node in communication with the first and second power transistors through a single output impedance matching network;
   a direct-current (DC) collector bias bus line disposed on the RF input side, the DC collector bias bus line connected to a shared collector node of the first and second power transistors; and
   a DC base bias bus line connected to respective bases of the first and second power transistors;
   wherein the first and second input impedance matching networks are disposed on an RF input side of the amplifier cell.

2. The apparatus of claim 1, wherein the first and second power transistors are connected in a common emitter configuration.

3. The apparatus of claim 2, wherein the first input impedance matching network is connected to a base of the first power transistor.

4. The apparatus of claim 3, wherein the single output impedance matching network is connected to a shared collector node of the first and second power transistors.

5. The apparatus of claim 1, further comprising:
   an RF ground capacitor connected to the shared collector node of the first and second power transistors through at least a portion of the output impedance matching network.

6. The apparatus of claim 1, wherein the first and second power transistors are identical.

7. An amplifier cell apparatus, comprising:
   an RF input node;
   first and second impedance circuits in communication with the RF input node, the first and second impedance circuits in communication with first and second power transistors, respectively;
   an RF ground capacitor disposed between the first and second impedance circuits; and
   a DC base bias bus line connected to respective bases of the first and second power transistors, the DC base bias bus line connected across and separate from at least a portion of the RF output impedance matching network.

8. The apparatus of claim 7, further comprising:
   a direct-current (DC) bias bus disposed across and spaced apart from the first impedance matching circuit on an input side of the first and second power transistors.

9. The apparatus of claim 8, further comprising:
   an RF output node connected to a shared node of the first and second power transistors through at least a portion of an RF output impedance matching network.

10. The apparatus of claim 9, wherein the shared node is a shared collector node.

11. The apparatus of claim 9, wherein the shared node is a shared drain node.

12. An amplifier cell operation method, comprising:
    splitting a radio-frequency (RF) input signal for presentation to first and second power transistors through first and second impedance matching networks, respectively;
    providing an RF output signal to an RF output node through a single output impedance matching network; and
    providing direct-current (DC) collector bias on the RF input side to a shared collector node of the first and second power transistors;
    wherein the first and second impedance matching paths are disposed on an RF input side of the first and second power transistors and the RF output node is on an RF output side of the first and second power transistors.

13. An amplifier cell operation method, comprising:
    splitting a radio-frequency (RF) input signal for presentation to first and second power transistors through first and second impedance matching networks, respectively;
    providing an RF output signal to an RF output node through a single output impedance matching network; and
    providing direct-current (DC) drain bias on the RF input side to a shared drain node of the first and second power transistors;
    wherein the first and second impedance matching paths are disposed on an RF input side of the first and second power transistors and the RF output node is on an RF output side of the first and second power transistors.

14. The method of claim 13, further comprising:
    providing a DC gate bias to respective gate terminals of the first and second power transistors.

* * * * *

UNITED STATES PATENT AND TRADEMARK OFFICE
CERTIFICATE OF CORRECTION

PATENT NO. : 9,537,453 B2
APPLICATION NO. : 14/517250
DATED : January 3, 2017
INVENTOR(S) : Zachary M. Griffith Page 1 of 1

It is certified that error appears in the above-identified patent and that said Letters Patent is hereby corrected as shown below:

In the Specification

Column 1, before BACKGROUND please add "This invention was made with government support under Contract No. FA8750-12-C-0279 awarded by the Department of the Air Force. The government has certain rights in the invention."

Signed and Sealed this
Fourteenth Day of November, 2017

Joseph Matal
*Performing the Functions and Duties of the*
*Under Secretary of Commerce for Intellectual Property and*
*Director of the United States Patent and Trademark Office*